United States Patent [19]

Boleky, III

[11] 3,791,024

[45] Feb. 12, 1974

[54] FABRICATION OF MONOLITHIC INTEGRATED CIRCUITS

[75] Inventor: Edward Joseph Boleky, III, Cranbury, N.J.

[73] Assignee: RCA Corporation, Princeton, N.J.

[22] Filed: Oct. 21, 1971

[21] Appl. No.: 191,455

[52] U.S. Cl. .................................... 29/577, 29/578

[51] Int. Cl. ............................................ B01j 17/00

[58] Field of Search ..............29/576 IW, 578, 580, 29/577, 576 OC; 317/235 AK, 235 AD

[56] References Cited

UNITED STATES PATENTS

| | | | |
|---|---|---|---|
| 3,290,753 | 12/1966 | Chang | 29/576 IW |
| 3,359,467 | 12/1967 | Cook | 29/576 OC |
| 3,442,011 | 5/1969 | Strieter | 29/576 IW |
| 3,570,114 | 3/1971 | Bean et al. | 29/577 |

*Primary Examiner*—W. C. Tupman
*Attorney, Agent, or Firm*—H. Christoffersen; R. P. Williams; M. Y. Epstein

[57] ABSTRACT

A portion of a layer of monocrystalline silicon on a substrate is completely oxidized through to provide islands of silicon spaced apart by the portion of silicon dioxide. Spaced apart, thin layers of semiconductor material are provided on the silicon dioxide portion. Different semiconductor components are provided within the semiconductor islands and within the thin semiconductor layers. Preferably, the upper surfaces of the silicon islands and the silicon dioxide isolating portions are substantially coplanar, and connectors for the various components are disposed on these surfaces.

8 Claims, 11 Drawing Figures

Patented Feb. 12, 1974

3,791,024

4 Sheets-Sheet 1

INVENTOR.
Edward J. Boleky, III.
BY M.Y. Epstein
ATTORNEY

INVENTOR.
Edward J. Boleky, III.
BY M. Y. Epstein
ATTORNEY

INVENTOR.
Edward J. Boleky, III.
BY M. Y. Epstein
ATTORNEY

INVENTOR.
Edward J. Boleky, III.
BY M. Y. Epstein
ATTORNEY

FABRICATION OF MONOLITHIC INTEGRATED CIRCUITS

BACKGROUND OF THE INVENTION

The invention herein described was made in the course of or under a contract with the Department of the Air Force.

This invention relates to the fabrication of semiconductor integrated circuits of the monolithic type.

The practice of incorporating various electronic components on a single (monolithic) chip or piece of semiconductor material is well known. One limitation on the type of components which can, on a practical basis, be incorporated on the same chip is that the various components must be relatively similar to one another with respect to the materials and dimensions of the components and with respect to the processes used to fabricate the components. When the components are too dissimilar with respect to these factors, separate semiconductor chips have to be used even in those cases where the circuit functions of the components involved most naturally "suggest" the use of a single chip. The use of separate chips often adds undesirable expense to the circuit.

DESCRIPTION OF PREFERRED EMBODIMENTS OF THE INVENTION

Figure 1:
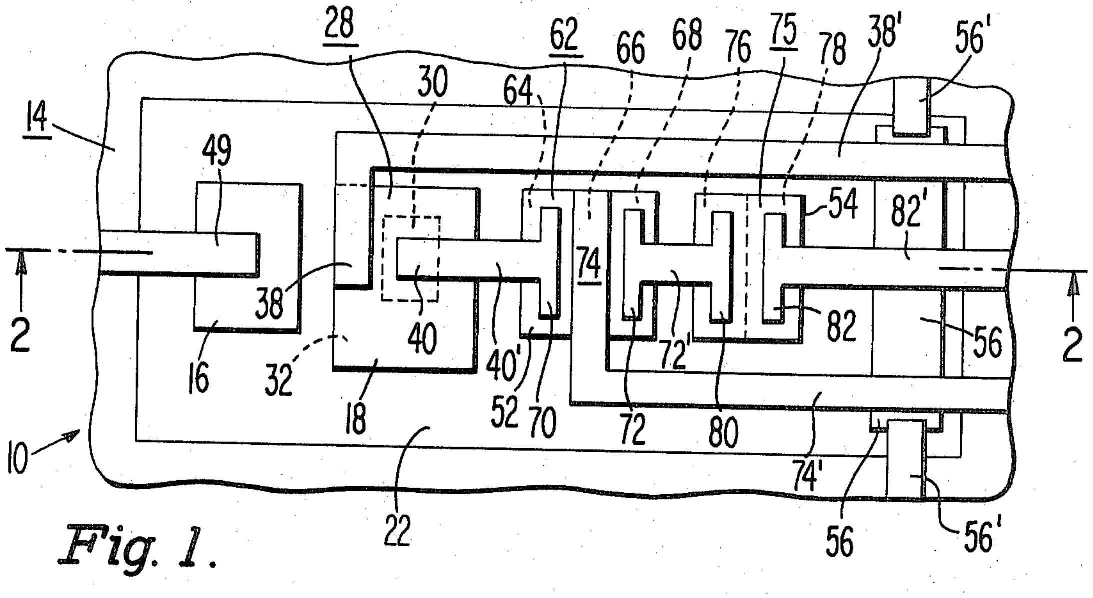
FIG. 1 is a plan view of a portion of a device made in accordance with the instant invention.
Figure 2:
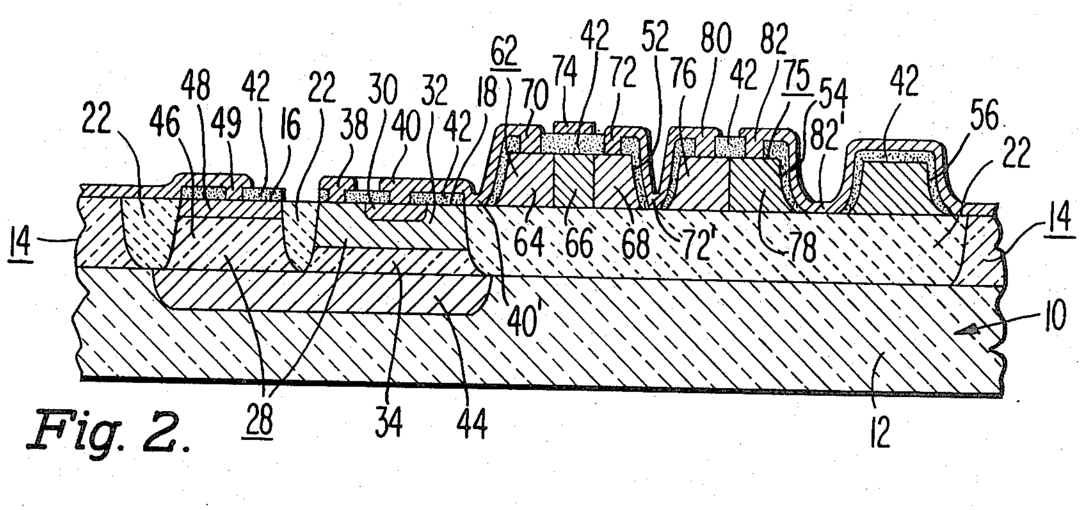
FIG. 2 is a sectional view of the device portion taken along the line 2—2 of FIG. 1.

An example of a portion of an integrated circuit device 10 made in accordance with the instant invention is shown in FIGS. 1 and 2. The device 10 comprises a substrate 12 of semiconductor material, e.g., monocrystalline silicon, having thereon a composite layer 14 comprising various islands 16 and 18 of semiconductor material, e.g., monocrystalline silicon, spaced apart within an island 22 of an insulating material, e.g., silicon dioxide. Only a portion of the device 10 is shown. In general, the device 10 will contain numerous islands of semiconductor material separated from each other by an island or islands of insulating material. Persons skilled in the semiconductor art will understand how complete devices, in accordance with this invention, can be designed and fabricated.

The island 18, comprises a semiconductor component of the type normally fabricated in monocrystalline semiconductor material, e.g., a bipolar transistor 28 in this embodiment. The transistor 28 comprises an emitter region 30 of N conductivity material having a thickness in the order of 5,000 A, a base region 32 of P conductivity material, having a thickness in the order of 10,000 A, and a collector region 34 of N conductivity material, having a thickness in the order of 10,000 A. The emitter region 30 and the base region 32 extend to the upper surface of the island 18 which is covered with a layer 42 of insulating material, e.g., silicon dioxide. Electrodes 38 and 40 are disposed on the layer 42 and extend through openings therethrough into contact with the base region 32 and the emitter region 30, respectively. The collector region 34 is connected to the island 16 via a highly doped region 44 within the substrate 12. The island 16 comprises two regions 46 and 48 of N conductivity which provide a conductive path between the region 44 and the upper surface of the island 16. An electrode 49, serving as the collector electrode for the transistor 28, extends through an opening through an insulating layer 42 on the island 16 and into contact with the region 48.

Although not shown, other semiconductor components can be provided in other semiconductor islands of the layer 14.

Disposed on portions of the upper surface of the island 22 are thin layers 52, 54, and 56 of a semiconductor material, e.g., silicon, having a thickness in the order of 10,000 A. Because of the manner in which the layers 52, 54, and 56 are preferably provided, as described hereinafter, these layers are polycrystalline. Covering portions of each of the layers 52, 54, and 56 are layers 42 of an insulating material, e.g., silicon dioxide.

The semiconductor layer 52 includes a field effect transistor 62 comprising a source region 64, a channel region 66, and a drain region 68. Overlying the insulating layer 42 on the semiconductor layer 52 are metal electrodes 70 and 72 each electrically connected to a different one of the source and drain regions 64 and 68, respectively, through openings through the layer 42. A gate electrode 74 is disposed on the insulating layer 42 overlying the channel region 66.

The thin layer 54 includes a *p-n* junction diode 75 comprising a region 76 of highly doped N conductivity and a region 78 of highly doped P conductivity. Metal electrodes 80 and 82 are provided on the insulating layer 42 connected to each of the regions 76 and 78, respectively, through openings through the layer 42.

The thin layer 56, including a covering layer 42 of an insulating material, comprises an insulated connector for interconnecting certain ones of the components of the device 10 while allowing cross-over thereof of other connectors of the device without electrical shorting therebetween.

Thus, by way of example of providing interconnections between the device components, the emitter electrode 40 of the transistor 28 is connected to the source electrode 70 of the transistor 62 via a connector 40'. The drain electrode 72 of the transistor 62 is connected to the electrode 80 of the diode 75 via a connector 72'. The electrode 82 of the diode 75, the gate electrode 74 of the transistor 62, and the base electrode 38 of the transistor 28 are connected to components (not shown) of the device 10 via (FIG. 1) connectors 82', 74', and 38', respectively, which pass over the insulated connector 56. Metal connectors 56' are electrically connected to the ends of the layer 56 through openings through the covering layer 42, the connectors 56' extending to other components (not shown) of the device 10. As shown, the connectors 38', 74', and 82' extend over the island 22 of silicon dioxide; an advantage of this being that the capacitive coupling between the connectors 38', 74', and 82' and other semiconductor components of the device 10 via the semiconductor substrate 12 is minimized. Also, because the transistor 28 is disposed within the island 22 of insulating material, good electrical isolation between the transistor 28 and other components (not shown) formed within other semiconductor islands of the composite layer 14 is provided.

The fact that the upper surfaces of the various islands comprising the layer 14 are coplanar, as shown in FIG. 2, is of importance with respect to the extension of the various connectors from island to island. By avoiding steps between the contiguous islands, over which the connectors would otherwise have to ascend and descend, the danger of discontinuity or breaks in the connectors is greatly reduced.

Figure 3:
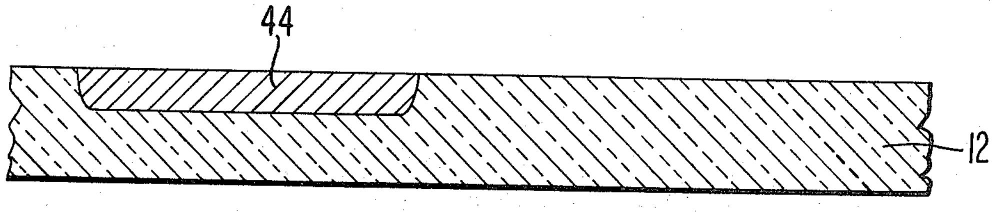
FIG. 3 is a cross-sectional view of a workpiece operated on in a sequence of steps to provide the device shown in FIGS. 1 and 2.

A method of fabricating the portion of the device 10 shown in FIGS. 1 and 2 is now described. A single piece of semiconductor material, e.g., a substrate 12 (FIG. 3) of monocrystalline silicon doped to be of P conductivity, is used as the starting workpiece. The shape and dimensions of the substrate are not critical.

Figure 4:
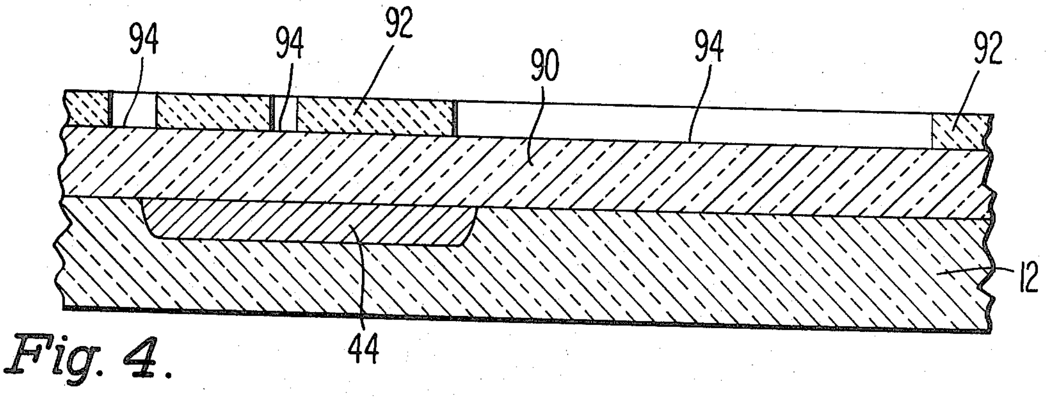
FIG. 4 is a view similar to that of FIG. 3 but showing the workpiece at a successive step in said sequence of steps.
Figure 5:
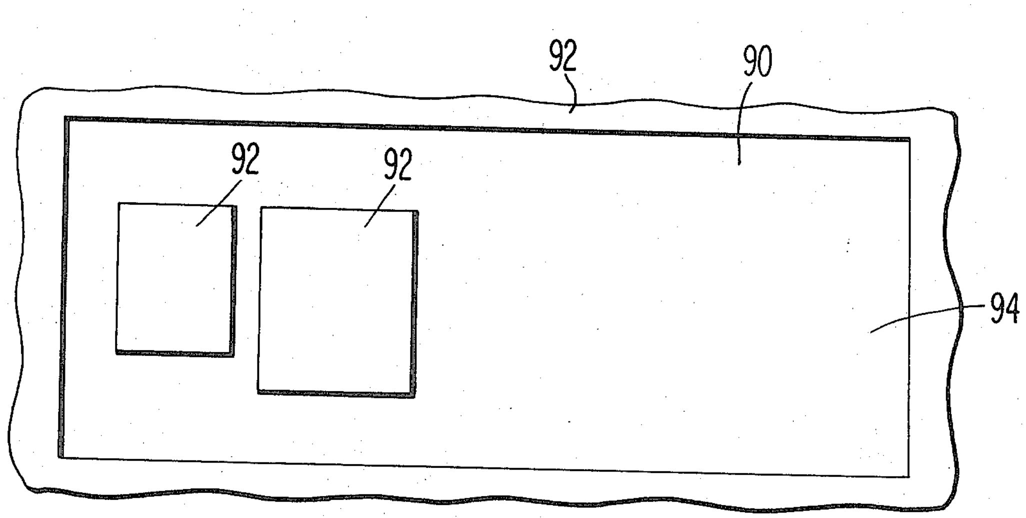
FIG. 5 is a plan view of the workpiece shown in FIG. 4.

Using known masking and diffusing techniques, a high concentration of doping impurities, e.g., arsenic or antimony at a surface concentration of $10^{21}$ atoms/cc, is diffused into the substrate 12 to provide the collector connector 44 of relatively high electrical conductivity. Then, a layer 90 (FIG. 4) of monocrystalline silicon of N conductivity, of about 0.6 ohm-cm, and of a thickness in the order of 20,000 A, is epitaxially deposited on the substrate 12. A layer 92 of a masking material, e.g., a 1,000 A thick layer of silicon nitride, is next deposited on the layer 90, and the masking layer 92 is defined by known techniques to expose a surface portion 94 (FIGS. 4 and 5) of the underlying layer 90.

Figure 6:
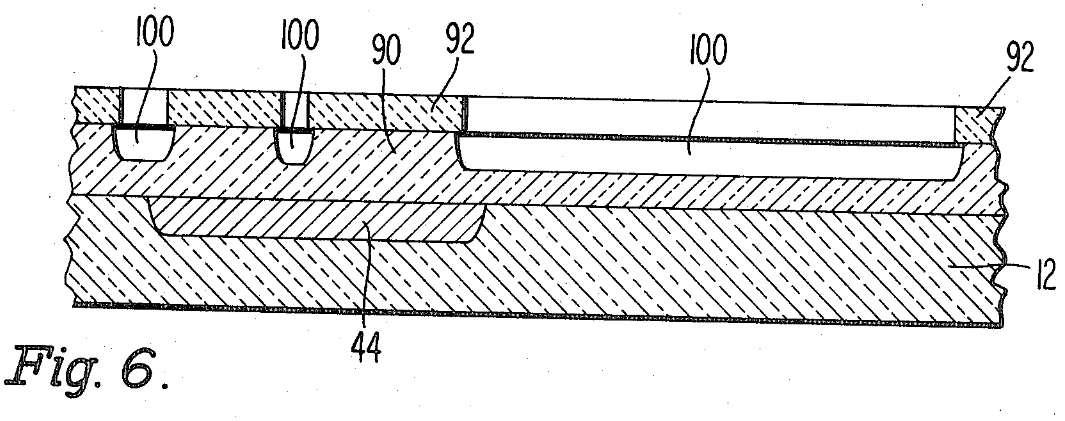
FIGS. 6, 7, and 8 are views similar to that of FIG. 4, but showing still later steps in said sequence of steps.
Figure 7:
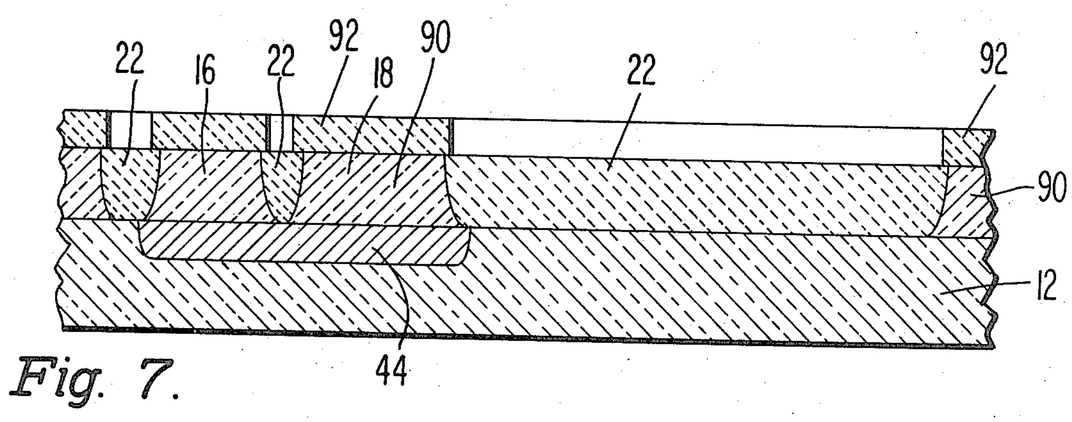

Then, using an etchant such as dilute gaseous hydrochloric acid in hydrogen or the liquid potassium hydroxide, the exposed portions of the layer 90 are etched (FIG. 6) to about half-way through the layer 90 to provide a cavity 100. The exposed portions of the silicon layer 90 are then oxidized (FIG. 7) using known thermal oxidation processes for a period of time sufficient to oxidize through the entire thickness of the remaining portion of the layer 90. Since the oxidizing process increases the amount of material present, in a ratio of about 2 to 1 by volume, by adding oxygen to the silicon, the upper surface of the resulting island 22 of silicon dioxide is substantially coplanar with the upper surface of the layer 90. As known, the silicon dioxide of the island 22 is of non-crystalline, amorphous form. The remaining portions of the layer 90 within the island 22 comprise the islands 16 and 18 of monocrystalline silicon.

Figure 8:
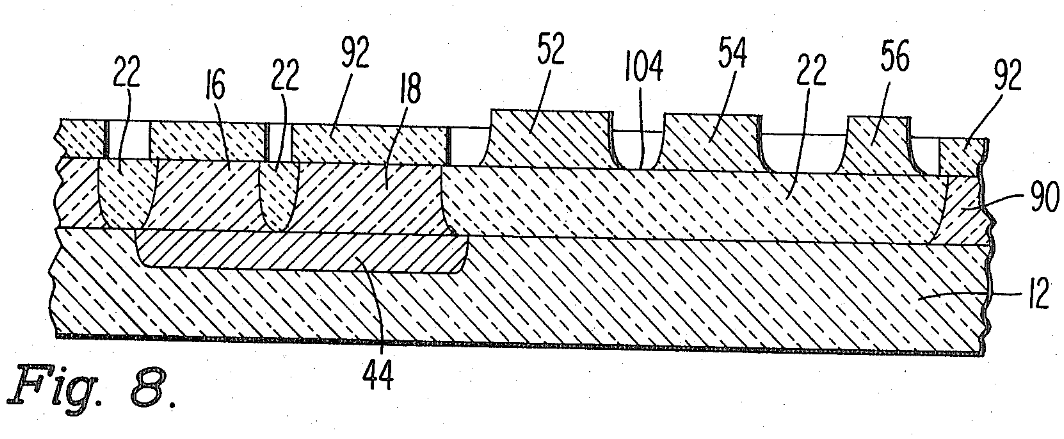
Figure 9:
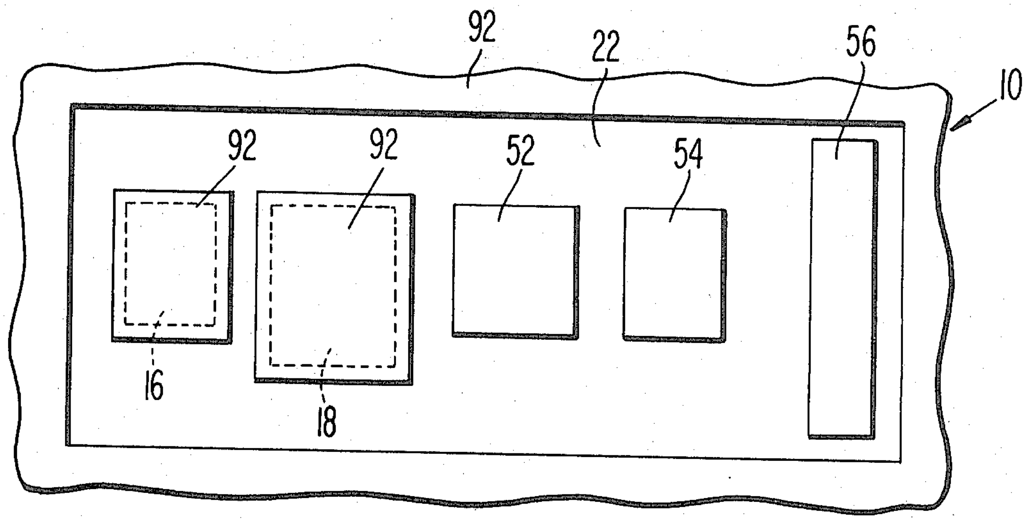
FIG. 9 is a plan view of the workpiece shown in FIG. 8.

A thin layer of P type silicon, e.g., of 10,000 A thickness, and having a doping concentration of boron in the order of $1 \times 10^{16}$ atoms/cc, is next deposited using, for example, known pyrolytic deposition techniques, on the upper surface of the workpiece and, using known masking and etching processes, the silicon layer is defined to provide the spaced layers 52, 54, and 56 (FIGS. 8 and 9) on the island 22. Since the silicon dioxide material of the island 22 is non-crystalline, the silicon, where it contacts the surface 104 of the silicon dioxide island 22, is polycrystalline.

As shown, the layers 52, 54, and 56 contact only the island 22 and are spaced from the semiconductor islands 16 and 18. This separation of the layers 52, 54, and 56 from the islands 16 and 18 improves the dielectric isolation among various ones of the components of the device 10, thus improving the performance of the device.

The silicon nitride masking layer 92 is now removed, as by etching, and the workpiece is now ready for the fabrication of semiconductor components therein. (In some instances, depending upon the particular device being made, the silicon nitride layer 92 can be left in place and used in the subsequent fabrication steps.) The spaced apart islands 16 and 18, being of monocrystalline silicon, are available for the fabrication of components of the type normally made in "bulk" silicon, i.e., wherein the substrate is of semiconductor material. The thin layers 52, 54, and 56, of polycrystalline silicon, are available for the fabrication of certain kinds of components normally made in thin semiconductor films on insulating substrates, an example of such components being known as silicon-on-sapphire (SOS) devices. An advantage of such thin film on insulating substrate devices is that reduced electrical coupling among the various components on the insulating substrate is provided, thereby providing circuits having more efficient electrical performance. While not critical, the thickness of the "thin" films of semiconductor material used in such devices is generally less than 20,000 A.

While not all types of semiconductor components normally fabricated in thin films of semiconductor material can be fabricated in the layers 52, 54, and 56, owing to the fact that these layers are of polycrystalline material, certain kinds of semiconductor components can be so fabricated. For example, *p-n* junction diodes, Schottky barrier diodes, and insulated gate field-effect transistors can be fabricated within the polycrystalline material with usable electrical performance.

Work is presently being done by various researchers to develop techniques for depositing certain insulating materials, such as aluminum oxide, in crystalline form on a substrate. If such techniques prove successful, such a crystalline insulating material could be used as a substrate for the thin layers 52, 54, and 56, in which case the silicon layers could be deposited in "epitaxic relation" with the crystalline substrate. That is, owing to the crystalline substrate, the silicon layers 52, 54, and 56 could be deposited in monocrystalline, rather than polycrystalline form. With such monocrystalline layers, semiconductor devices of substantially improved quality can be provided.

Figure 10:
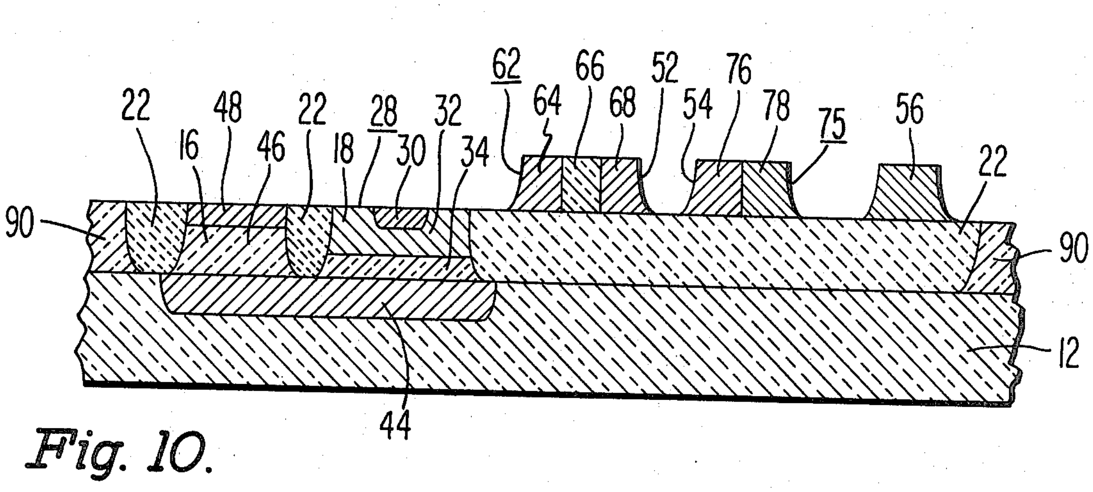
FIG. 10 shows a further step in said sequence of steps.

To complete the device, standard masking and diffusion techniques are used to form the various regions of the various semiconductor components of the device. Of significant importance is the fact that certain ones of the diffusions can be used to form regions in the "bulk" silicon islands 16 and 18 simultaneously with the formation of regions in various ones of the thin layers 52, 54, and 56. Thus, using P type diffusion the P base region 32 (FIG. 10) of the island 18 is formed simultaneously with the conversion of the island 56 from low P conductivity as originally deposited to high P conductivity (e.g., the layer 56 is doped with boron to a surface concentration of about $1 \times 10^{18}$ atoms/cc). Then, using an N type diffusion, the collector contact region 48 of the island 16 and the emitter region 30 of the island 18 are formed simultaneously with the formation of the source region 64 and the drain region 68 in the thin layer 52 and the region 76 in the thin layer 54.

Each of the diffusions into the various layers 52, 54, and 56 is preferably entirely through the thickness (e.g., 10,000 A) of these layers. While the depths of the diffusions into the layers 16 and 18 to provide the regions 48 and 30, respectively, (e.g., 5,000 A) is less than the depths of the diffusions completely through the layers 52, 54, and 56, simultaneous diffusions can still be made owing to the fact that the rate of diffusion through the polycrystalline silicon of the layers 52, 54, and 56 is much faster than the rate of diffusion through the monocrystalline silicon of the islands 16 and 18.

Finally, using standard techniques, a thin layer 42 (FIG. 2) of silicon dioxide is thermally grown on the exposed surfaces of the various bodies of silicon, openings are provided through the layers 42 to expose surface portions of various ones of the silicon bodies, and a layer of metal, e.g., aluminum having a thickness of 1,000 A, is deposited on the workpiece and defined in known manner to provide the various electrodes and connectors shown in FIGS. 1 and 2.

As previously noted, the upper surface of the composite layer 14 (FIG. 2) is planar, thereby eliminating steps between the various islands of the layer 14 and reducing the danger of the presence of discontinuities in the metal connectors extending from island to island of the layer 14. Although the thin silicon layers 52, 54, and 56 and the various covering insulating layers 42 do provide steps in the device 10, owing to the thinness of the layers 52, 54, and 56, in the order of 10,000 A, and the thinness of the insulating layers 42, in the order of 1,000 A, the size of these steps is adequately small to avoid excessive loss of product owing to connector discontinuities.

Figure 11:
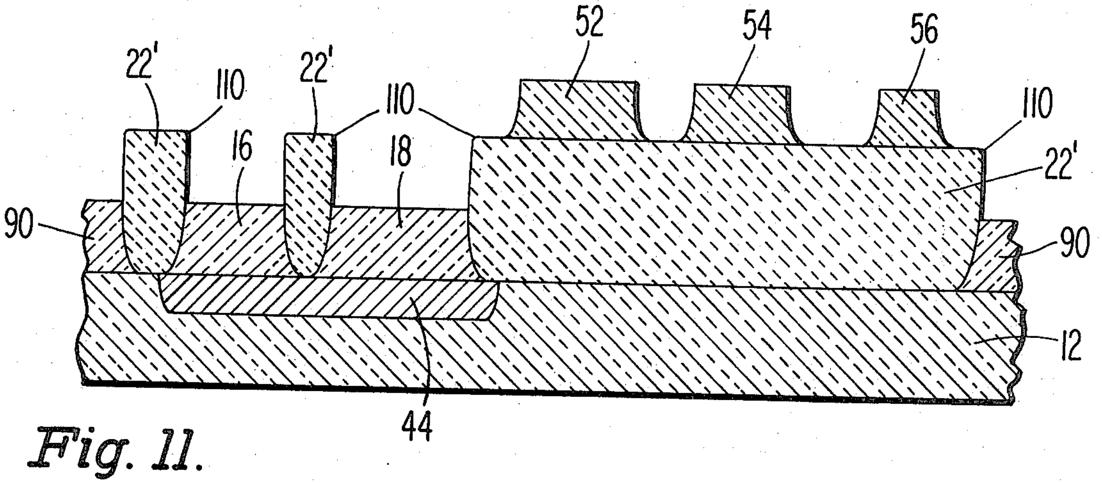
FIG. 11 is a cross-sectional view of a workpiece operated on in accordance with a different embodiment of the invention.

With reference to FIG. 11, another embodiment of the invention is shown. In this embodiment, instead of forming a cavity 100 (FIG. 6) in the layer 90 on the substrate 12, the portion 94 (FIGS. 4 and 5) of the layer 90 exposed through the masking layer 92 are thermally oxidized to form an island 22′ (FIG. 11) of silicon dioxide. In the oxidizing process, the layer 90 is oxidized through its entire thickness, the resulting island 22′ thus extending above the upper surface of the layer 90 a distance about equal to the thickness of the layer 90. This occurs as a result of the oxidizing process in which oxygen is added to the silicon. The thin films 52, 54, and 56 of silicon are then formed on the upper surface of the island 22′. Completion of this workpiece can proceed in the same manner as the completion of the workpiece shown in FIG. 8.

An advantage of the embodiment shown in FIG. 11 is that an island 22′ having an extremely flat and smooth upper surface can be provided. In the first described embodiment, in which a cavity 100 is formed, the etching process preferably used to form the cavity may result in a somewhat rough and uneven surface at the bottom of the cavity. The thermally grown island 22 (FIG. 7) formed in the cavity 100 tends to mirror or reproduce this roughness, whereby the upper surface of the island 22 tends to be likewise rough and uneven. For best reproducibility of characteristics from device to device, islands having smooth upper surfaces on which the thin semiconductor films and connectors are to be formed is desired.

While, in this last described embodiment, the edges 110 of the island 22′ do form steps with respect to the other islands 16 and 18 and the layer 90, it is feasible to fabricate the island 22′ of such thickness, e.g., with the steps 110 having a height of about 10,000 A, and preferably less than 20,000 A, that the presence of these steps does not give rise to any significant problem with respect to the forming of the metal interconnections thereover.

I claim:

1. A method of fabricating an integrated circuit comprising:

diffusing a high concentration of impurities into a region of a semiconductor body at a surface thereof to form a first region of relatively high conductivity;

epitaxially depositing a layer of monocrystalline silicon onto said surface of said body;

oxidizing through the entire thickness of said layer to convert portions thereof to silicon dioxide and thus provide two islands of silicon separated by said portions, said islands contacting different portions of said first region of said substrate and being electrically connected together thereby;

providing on a surface of one of said portions of silicon dioxide inwardly of the edges thereof spaced apart thin layers of a semiconductor material;

forming a semiconductor component within said two islands of silicon and forming a semiconductor component within one of said thin layers; and providing electrical connector for said components on surfaces of said islands and on surfaces of said thin layers, some of said connectors extending from said semiconductor islands onto surfaces of said portions.

2. The method of claim 1 wherein said silicon dioxide portions project beyond said surface of said layer a distance in the order of 10,000 A, the thickness of said layer being in the order of 10,000 A.

3. The method of claim 1 wherein said surfaces of said islands and of said portions are substantially coplanar.

4. The method of claim 1 including the steps of:

providing another of said thin layers of semiconductor material with a high doping concentration for good electrical conductivity thereof;

providing an insulating coating on a portion of said another layer; and extending one of said connectors across said coated portion of said another layer.

5. The method of claim 1 wherein said step of forming said semiconductor components includes the simultaneous diffusion of a conductivity modifier into one of said islands of semiconductor material and into said one thin layer.

6. The method of claim 5 wherein said thin layer is of polycrystalline silicon, the depth of said diffusion into said layer being greater than the depth of said simultaneous diffusion into said island.

7. A method of fabricating an integrated circuit in a body of semiconductor material having a surface, comprising the steps of:

epitaxially depositing a layer of monocrystalline silicon onto said surface of said body;

oxidizing portions of said layer to convert said portions thereof to silicon dioxide to thus provide at least two islands of silicon separated by said portions;

providing on a surface of one of said portions of silicon dioxide, inwardly of the edges thereof, a thin layer of a semiconductor material;

forming a semiconductor component within each of said two islands of silicon and forming a semiconductor component within said thin layer of semiconductor material; and providing electrical connectors for said components on surfaces of said islands and on a surface of said thin layer, some of said connector extending from said semiconductor islands onto surfaces of said portions of silicon dioxide.

8. The method of claim 7 wherein said oxidizing step is carried out for a time sufficient to convert the entire thickness of said portions of said monocrystalline silicon layer to silicon dioxide.

* * * * *